United States Patent

Lowney et al.

(10) Patent No.: US 9,128,148 B2
(45) Date of Patent: Sep. 8, 2015

(54) PACKAGE INTEGRITY MONITOR WITH SACRIFICIAL BUMPS

(71) Applicant: Xilinx, Inc., San Jose, CA (US)

(72) Inventors: Donnacha Lowney, Dublin (IE); Marites De La Torre, Dublin (IE)

(73) Assignee: XILINX, INC., San Jose, CA (US)

( * ) Notice: Subject to any disclaimer, the term of this patent is extended or adjusted under 35 U.S.C. 154(b) by 201 days.

(21) Appl. No.: 13/789,347

(22) Filed: Mar. 7, 2013

(65) Prior Publication Data

US 2014/0253171 A1    Sep. 11, 2014

(51) Int. Cl.
   *G01R 31/28*      (2006.01)
   *H01L 21/66*      (2006.01)
   *H01L 25/065*     (2006.01)
   *G01R 31/3185*    (2006.01)

(52) U.S. Cl.
   CPC ...... *G01R 31/2896* (2013.01); *G01R 31/31855* (2013.01); *H01L 22/34* (2013.01); *H01L 25/0657* (2013.01); *H01L 2224/16225* (2013.01); *H01L 2924/15192* (2013.01); *H01L 2924/15311* (2013.01)

(58) Field of Classification Search
   CPC ............... G01R 31/318511; G01R 31/3004; G01R 31/1886; G01R 31/2831; H01L 22/34
   USPC ........................................ 324/762.03, 762.05
   See application file for complete search history.

(56) References Cited

U.S. PATENT DOCUMENTS

| | | | |
|---|---|---|---|
| 6,166,607 A | 12/2000 | Schoellkopf | |
| 6,867,613 B1 * | 3/2005 | Bienek | 324/750.3 |
| 7,945,827 B1 * | 5/2011 | Briggs | 714/724 |
| 8,120,356 B2 * | 2/2012 | Agarwal et al. | 324/300 |
| 8,327,201 B1 * | 12/2012 | Lai | 714/725 |
| 8,832,511 B2 * | 9/2014 | Chen et al. | 714/733 |
| 2004/0183187 A1 * | 9/2004 | Yamasaki et al. | 257/700 |
| 2010/0153043 A1 | 6/2010 | Su et al. | |
| 2011/0001508 A1 | 1/2011 | Sekiguchi et al. | |
| 2012/0261662 A1 * | 10/2012 | Liang et al. | 257/48 |
| 2012/0298410 A1 | 11/2012 | Lu et al. | |
| 2012/0319717 A1 * | 12/2012 | Chi | 324/756.05 |
| 2013/0076387 A1 * | 3/2013 | Ishikawa et al. | 324/762.03 |

FOREIGN PATENT DOCUMENTS

EP    2 341 356 A1    7/2011

* cited by examiner

*Primary Examiner* — Arleen M Vazquez
*Assistant Examiner* — Dominic Hawkins
(74) *Attorney, Agent, or Firm* — Gerald Chan

(57) ABSTRACT

An apparatus with package integrity monitoring capability, includes: a package having a die connected to an interposer through a plurality of bumps, wherein at least some of the bumps comprise dummy bumps; a package integrity monitor having a transmitter to transmit a test signal and a receiver to receive the test signal; and a first scan chain comprising a plurality of alternating interconnects in the die and in the interposer connecting some of the dummy bumps in series, wherein the first scan chain has a first end coupled to the transmitter of the package integrity monitor and a second end coupled to the receiver of the package integrity monitor.

20 Claims, 6 Drawing Sheets

PACKAGE INTEGRITY MONITOR WITH SACRIFICIAL BUMPS

FIELD OF THE APPLICATION

An embodiment described herein relates to systems for monitoring package integrity of integrated circuit (IC) packages.

BACKGROUND

In many integrated circuit systems, a die is connected to an interposer by bonding microbumps on the die with corresponding pads on the interposer. However, yield loss may occur during assembly due to bonding failures between the microbumps on the die and the pads on the interposer. While bonding failures may potentially happen for any microbump on the die, due to the increased mechanical stress at the outer edges of the die, it may be more likely for bonding failures to occur for microbumps located at the edges of the die. This problem has led to the use of a buffer zone that includes sacrificial dummy bumps around the edges of a die.

Dummy bumps on the die typically perform no other functions beyond providing a buffer zone and satisfying minimum density requirements. However, Applicant of the subject application determines that it may be desirable to utilize dummy bumps to help monitor the package integrity of a device. Such would provide an early-warning system to help determine when a die is likely to experience a failure, or when a die has failed because it has been assembled incorrectly.

SUMMARY

An apparatus with package integrity monitoring capability, includes: a package having a die connected to an interposer through a plurality of bumps, wherein at least some of the bumps comprise dummy bumps; a package integrity monitor having a transmitter to transmit a test signal and a receiver to receive the test signal; and a first scan chain comprising a plurality of alternating interconnects in the die and in the interposer connecting some of the dummy bumps in series, wherein the first scan chain has a first end coupled to the transmitter of the package integrity monitor and a second end coupled to the receiver of the package integrity monitor.

Optionally, the package integrity monitor may be configured to provide a failure signal if there is a discontinuity in the first scan chain.

Optionally, the apparatus may further include a second scan chain, wherein the package integrity monitor is configured to determine which of the first scan chain and the second scan chain in which an error has occurred.

Optionally, the package integrity monitor may be configured to transmit additional signals during an operation of the package.

Optionally, the package integrity monitor may further include a time-to-digital converter configured to measure a time for the test signal to travel through the first scan chain.

Optionally, the package integrity monitor may be configured to provide a failure signal if the measured time through the first scan chain is outside an allowable range.

Optionally, the first scan chain may comprise a load in an oscillator network.

Optionally, the package integrity monitor may be configured to measure an oscillation frequency of the oscillator network, and provide a failure signal if the oscillation frequency is outside an allowable range.

Optionally, the apparatus may further include a second scan chain, wherein at least one of the dummy bumps is both a part of first scan chain and a part of the second scan chain.

Optionally, the first scan chain may form a first ring, and the apparatus may further include a second scan chain forming a second ring that surrounds the first ring.

An apparatus with package integrity monitoring capability, includes: a substrate connected to an interposer through a plurality of bumps, wherein at least some of the bumps comprise dummy bumps; a package integrity monitor having a transmitter to transmit a test signal and a receiver to receive the test signal; and a first scan chain having a plurality of alternating interconnects in the interposer and in the substrate connecting some of the dummy bumps in series, wherein the first scan chain has a first end coupled to the transmitter of the package integrity monitor and a second end coupled to the receiver of the package integrity monitor.

Optionally, the package integrity monitor may be configured to provide a failure signal if there is a discontinuity in the first scan chain.

Optionally, the package integrity monitor may further include a time-to-digital converter configured to measure a time for the test signal to travel through the first scan chain, and wherein the package integrity monitor may be configured to provide a failure signal if the measured time through the first scan chain is outside an allowable range.

Optionally, the first scan chain may comprise a load in an oscillator network, and wherein the package integrity monitor may be configured to measure an oscillation frequency of the oscillator network, and provide a failure signal if the oscillation frequency is outside an allowable range.

A method for monitoring integrity of a package comprising a die connected to an interposer through a plurality of bumps, wherein at least some of the bumps comprise dummy bumps, the method includes: generating a test signal by a package integrity monitor located at the package; and transmitting the test signal through a first scan chain, the first scan chain comprising a plurality of alternating interconnects in the die and in the interposer connecting some of the dummy bumps in series.

Optionally, the method may further include receiving the test signal by the package integrity monitor.

Optionally, the method may further include providing a failure signal if the package integrity monitor does not receive the test signal from the first scan chain.

Optionally, the test signal may be transmitted during an operation of the package.

Optionally, the method may further include: using a time-to-digital converter to measure a time for the test signal to travel through the first scan chain; and providing a failure signal if the measured time is outside an allowable range.

Optionally, the first scan chain may comprise a load on an oscillator network, and the method may further include providing a failure signal if an oscillation frequency of the oscillation network is outside an allowable range.

Other and further aspects and features will be evident from reading the following detailed description.

BRIEF DESCRIPTION OF THE DRAWINGS

The drawings illustrate the design and utility of embodiments, in which similar elements are referred to by common reference numerals. These drawings are not necessarily drawn to scale. In order to better appreciate how the above-recited and other advantages and objects are obtained, a more particular description of the embodiments will be rendered which are illustrated in the accompanying drawings. These drawings depict only exemplary embodiments and are not therefore to be considered limiting of the scope of the claims.

FIG. 2-1 illustrates a cross sectional view of an IC package with a package integrity monitor;

FIG. 2-2 illustrates a top view of an IC package with a package integrity monitor;

FIG. 2-3 illustrates a top view of an IC package with a package integrity monitor and additional scan chains; and FIG. 3 illustrates a flow chart of a method for using dummy bumps to monitor package integrity of an IC package.

DETAILED DESCRIPTION

Figure 1:
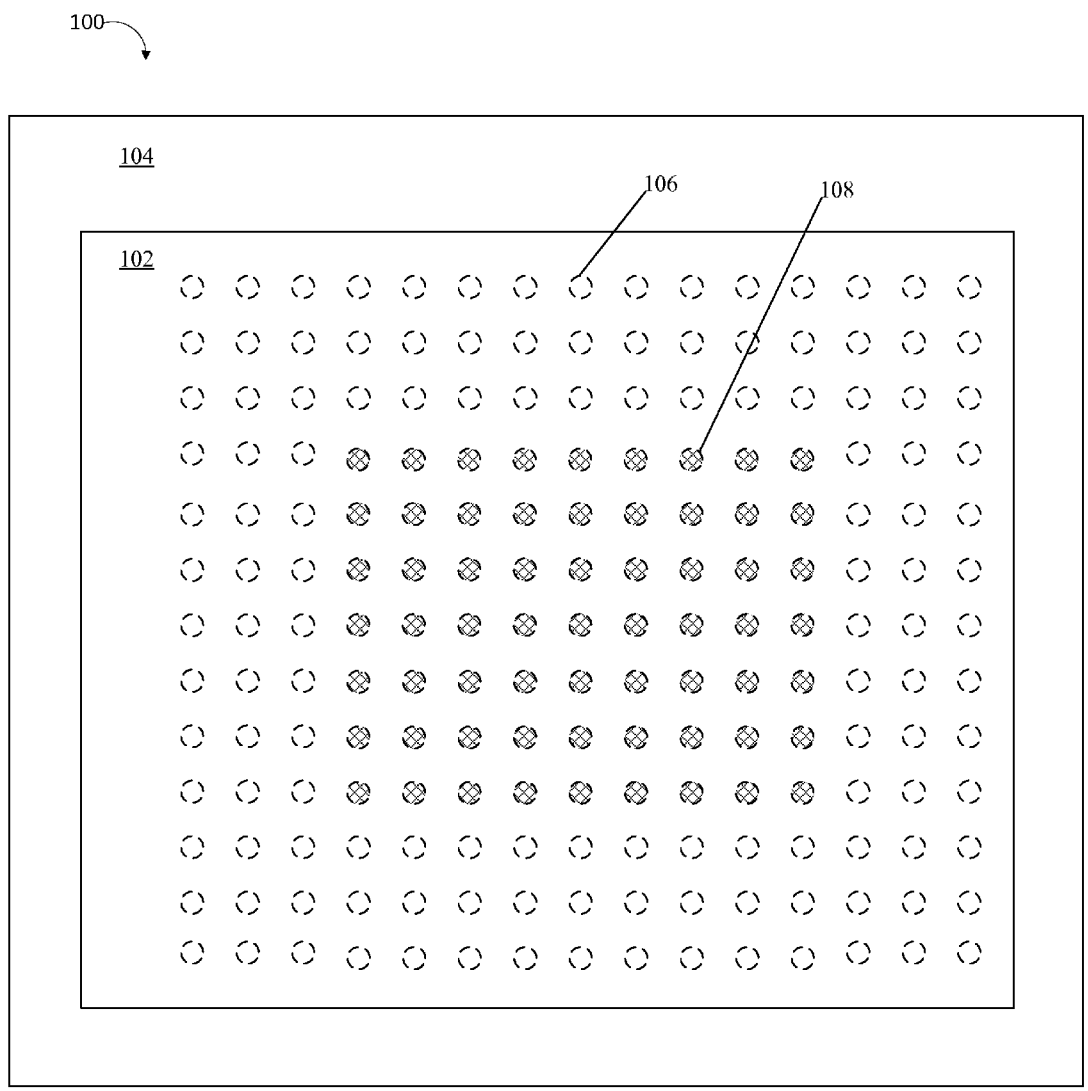
FIGS. 1-1 and 1-2 illustrate a top view and a cross sectional view of an example of an IC package and substrate.

Various features are described hereinafter with reference to the figures. It should be noted that the figures are not drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments, even if not so illustrated, or if not explicitly described. Also, reference throughout this specification to "some embodiments" or "other embodiments" means that a particular feature, structure, material, or characteristic described in connection with the embodiments is included in at least one embodiment. Thus, the appearances of the phrase "in some embodiments" or "in other embodiments" in various places throughout this specification are not necessarily referring to the same embodiment or embodiments.

Figures 1, 2:
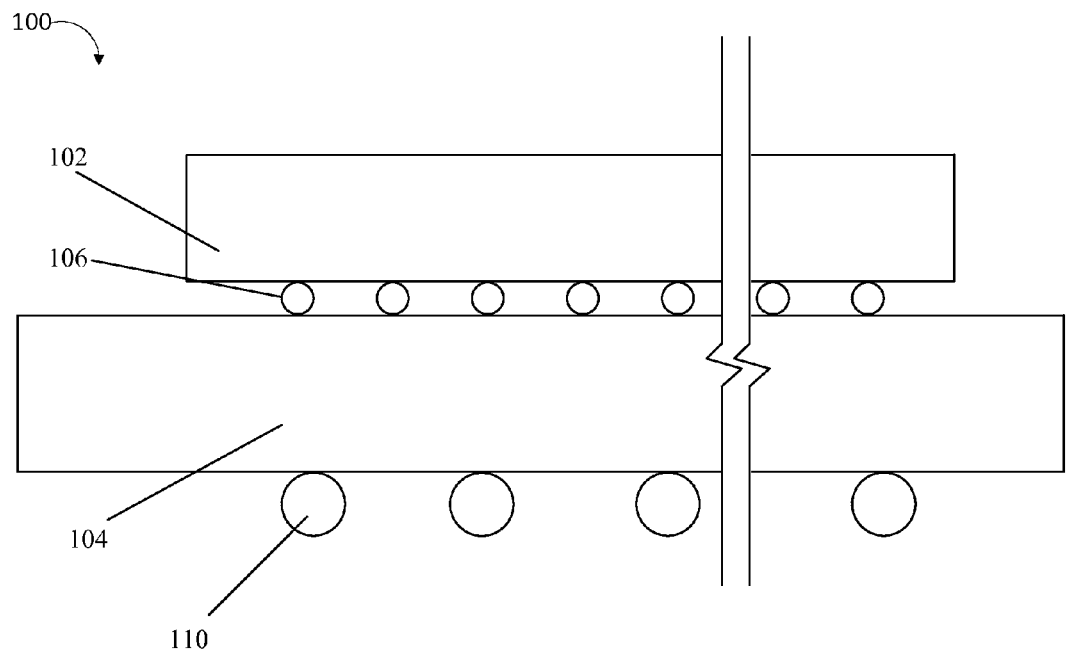

FIGS. 1-1 and 1-2 illustrate a top view and a cross sectional view of an IC package 100. The IC package comprises a die 102 and an interposer 104. The die 102 is mounted on the interposer 104, by connecting a plurality of microbumps 106 and 108 on the die 102 to corresponding pads on interposer 104. In some cases, the interposer 104 may itself be mounted on a substrate (not shown) through a plurality of bumps (e.g., C4 balls) 110 (shown in FIG. 1-2).

During assembly of IC packages, yield loss may occur due to bonding failures between the microbumps on the die 102 and the pads on the interposer 104. While bonding failures may potentially occur for any microbump on the die 102, it is much more likely to occur for microbumps located at the edges of the die 102, due to the increased mechanical stress in those locations. For this reason, a buffer zone may be provided that comprises several rings of sacrificial dummy bumps at the outer regions of the die 102 (e.g., next to the outside edges of the die 102), while active microbumps located at the inner region of the die 102 (e.g., away from the edges of the die 102) provide functional support for the active circuit elements on the die 102. For example, FIG. 1-1 illustrates the IC package 100 with three rings of dummy bumps 106 on the outer regions of the die 102 (wherein the outer regions are next to the outside edges of the die 102), while active microbumps 108 are located at the inner region of the die 102, (wherein the inner region is away from the outer edges of the die 102).

In the IC package 100, the sacrificial dummy bumps 106 contain no active circuit elements, and serve no other purpose in the package beyond providing a buffer zone and satisfying minimum density requirements. However, it is contemplated that these unused dummy bumps may be utilized to help monitor package integrity and detect potential failures in IC packages.

In the assembly of IC packages, a known good die (KGD) strategy may be employed. In particular, individual dies are tested first, and the known good dies that pass the tests are assembled onto interposers to form IC packages. Once assembled, each package is then tested as a whole.

However, there are typically no intermediate tests that occur between the determination of known good die and the package test. For example, there is usually no test at the stage of assembling the die onto the interposer to check the connectivity of the die to the interposer. Also, there is usually no further test for assessing the connectivity between the die and the interposer during an actual operation of the IC package. Making use of the existing sacrificial dummy bumps in the IC package will allow for an intermediate test to test the die-to-interposer connectivity, and will allow for monitoring the die-to-interposer connectivity during the course of operation of the IC package.

FIG. 2-1 illustrates a cross sectional view of an IC package 100 with a package integrity monitor. The IC package 100 includes a die 102 that contains a package integrity monitor 202 and one or more scan chains 208. The IC package 100 also includes an interposer 104 coupled to the die 102 through microbumps (e.g., dummy bumps 106 and active bumps like the microbumps 108 shown in FIG. 1-1). The package integrity monitor 202 includes a transmitter 204 and a receiver 206. In some cases, the package integrity monitor 202 may be implemented as a chip or a component in/of a chip. In the illustrated figure, the transmitter 204 and the receiver 206 are illustrated to be parts of a same component (e.g., they may be parts of a same hardware module). Alternatively, the transmitter 204 of the package integrity monitor 202 and the receiver 206 of the package integrity monitor 202 may be separate and spaced apart from each other, and may be located at different areas in the IC package 100. Each scan chain 208 is connected to the transmitter 204 on one end of the scan chain 208, and to the receiver 206 on the other end of the scan chain 208. The package integrity monitor 202 is configured to transmit a test signal from the transmitter 204 that travels through a scan chain 208, and to receive the test signal at the receiver 206 from the other end of the scan chain 208.

Each of the scan chains 208 connects in series a plurality of dummy bumps 106 by alternating interconnects 210 in the die 102, and interconnects 212 in the interposer 104. This creates a signal path that travels through each dummy bump along the scan chain 208.

If there is a break in a scan chain 208, then the test signal transmitted by the transmitter 204 to the scan chain 208 will no longer be able to reach the receiver 206. While it is possible for a break in a scan chain 208 to be caused by a failure of an interconnect 210 at the die 102, or an interconnect 212 at the interposer 104, in most cases it will be due to a bonding failure in one of the dummy bumps 206 in the scan chain 208. These bonding failures may occur during assembly. Thus, in some cases, the transmission of test signal(s) by the package integrity monitor 202 may be performed during a manufacturing process for the IC package 100. The bonding failures may also occur during operation of the IC package 100 due to stresses caused by voltage, temperature, and other factors. Accordingly, in other cases, the transmission of test signal(s) by the package integrity monitor 202 may be performed during an operation life of the IC package 100. In one implementation, the package integrity monitor 202 may be configured to generate and transmit the test signal(s) periodically, e.g., in regular intervals, or in response to detected events (such as a powering up of a device that includes the IC package 100). In still other cases, the transmission of test signal(s) by the package integrity monitor 202 may be performed during a manufacturing process for the IC package 100, as well as during an operation life of the IC package 100. Regardless of when the test signal(s) is transmitted, when a bonding failure happens, the package integrity monitor 202 detects a discontinuity in the corresponding scan chain 208 and returns an error.

Due to the dummy bumps 106 not being part of any of the active device circuitry (except for the package integrity monitor 202) in the IC package 100, a bonding failure in a dummy bump 106 does not necessarily mean that there is an actual failure on the device. However, a failure in one of the dummy bumps 106 during operation of the IC package 100 may be indicative of increased stresses or impending failure on other microbumps on the die 102, including important active bumps. Thus, it is desirable to be able to monitor the connectivity of the dummy bumps 106 in order to detect possible future failures in the active bumps. The package integrity monitor 202 located on the die 102 allows test signals to be generated while the IC package 100 is in operation, monitoring the connectivity of the dummy bumps 106 through scan chains 208 while the active circuits in the IC package 100 are running.

There are various combinations of transmit and receive circuits that may be used for the test signal to drive the scan chains 208. In some cases, a transmit buffer with sufficient drive strength to drive a RC network of an interconnect structure, and a receive buffer interfacing to a digital logic of the package integrity monitor 202 may be used. During testing, a logic high would be transmitted, which if recorded at the receive buffer, would result in a "pass". The input of the receive buffer may have a weak pull-down resistor in order to clearly define the buffer state in the event of a failure.

FIG. 2-2 illustrates a top view of an IC package 100 with three rings of dummy bumps 106. The three rings of dummy bumps 106 are located at the outer region of the die 102 (e.g., next to the edges of the die 102). The IC package 100 also includes active bumps (like the bumps 108 shown in FIG. 1-1), which are omitted in the figure for clarity. As shown in FIG. 2-2, there are three scan chains, 208-1, 208-2, and 208-3, one for each ring of dummy bumps 106. Each scan chain 208-1, 208-2, and 208-3 is connected on one end to a transmitter (not shown) located in package integrity monitor 202, and on the other end to a receiver (not shown) located in package integrity monitor 202. In some cases, the package integrity monitor 202 is configured to generate a separate test signal for each scan chain 208. In other cases, the package integrity monitor 202 may be configured to generate a same test signal that is transmitted through all scan chains. Each scan chain 208 includes a plurality of alternating interconnects 210 at the die 102 ("die interconnects") and interconnects 212 at the interposer 104 ("interposer interconnects"), so that all dummy bumps 106 along each scan chain 208 are connected in series. A disconnect at any one dummy bump 106 in the scan chain 208 will cause a discontinuity in the entire scan chain 208.

The receiver in package integrity monitor 202 may include muxing facilities to receive signals from each individual scan chain (208-1, 208-2, 208-3). If there is a discontinuity in one scan chain 208, the receiver at the package integrity monitor 202 will be able to determine which scan chain 208 has the discontinuity. Because each scan chain 208 covers all the dummy bumps 106 in one ring, the package integrity monitor 202 will be able to determine in which ring the failure occurred. In some cases, the receiver in the package integrity monitor 202 may include a register for result diagnosis, with bits in the register being set according to which scan chains 208 are passing and which are failing. In other cases, the package integrity monitor 202 may include a probe pad, or the IC package 100 may include a probe pad coupled to the package integrity monitor 202. An Automatic Test Equipment (ATE) may then be used to measure a voltage level on the probe pad, which would indicate whether a particular scan chain is passing or failing.

Figures 1, 2:
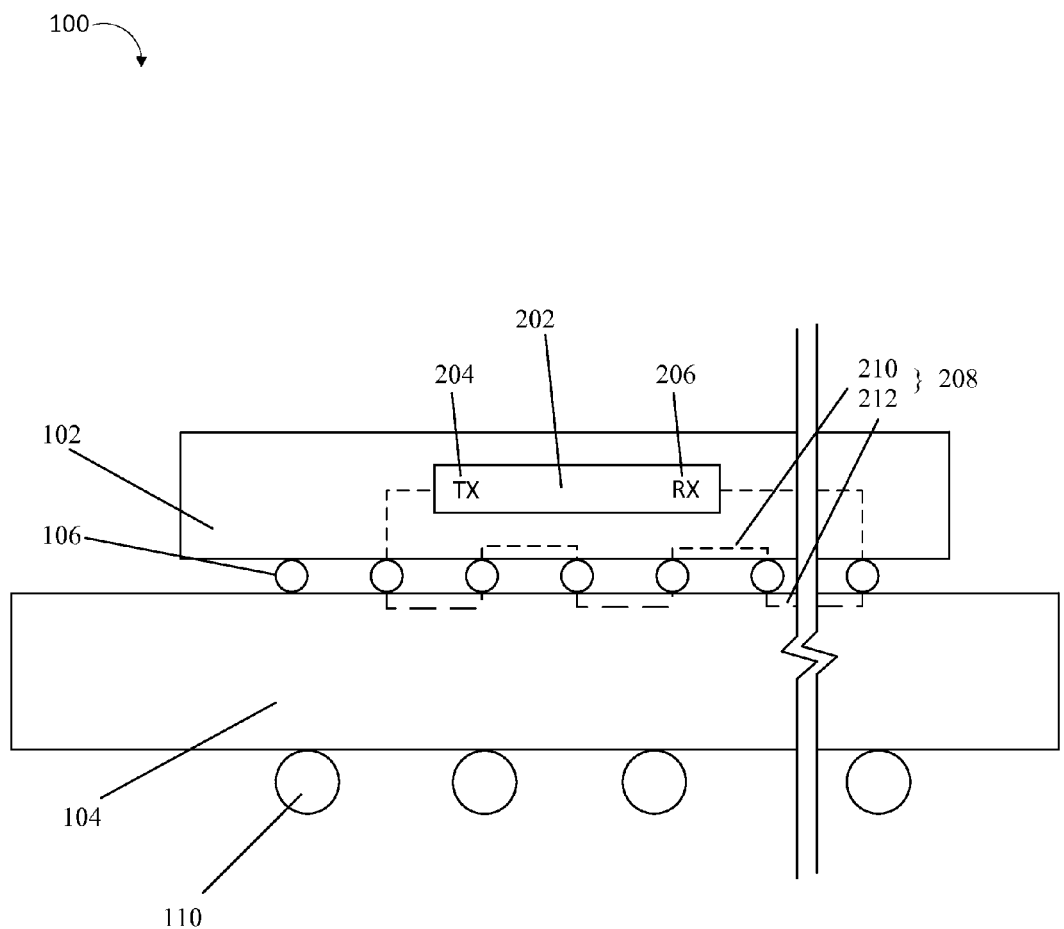
Figure 2:
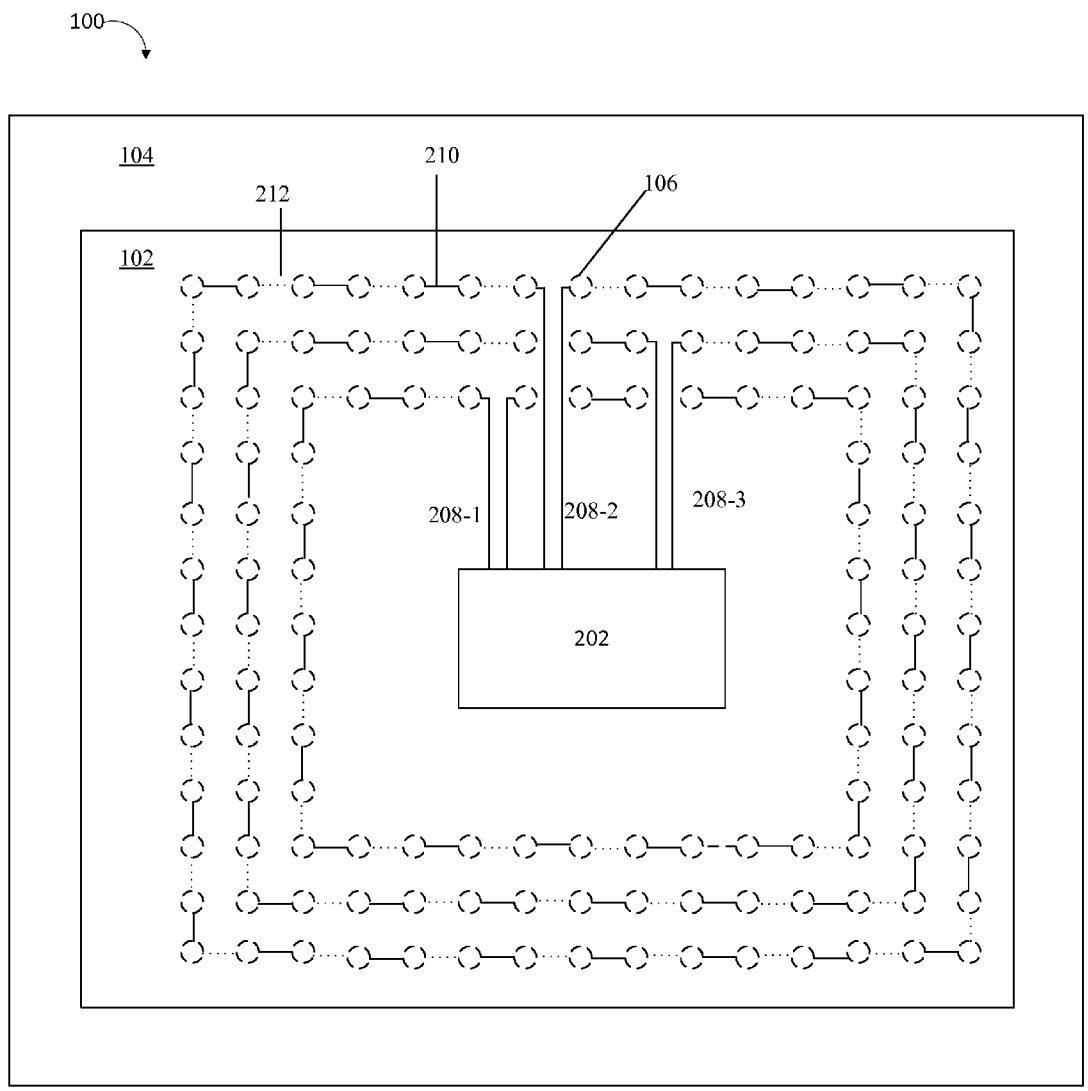
Figures 2, 3:
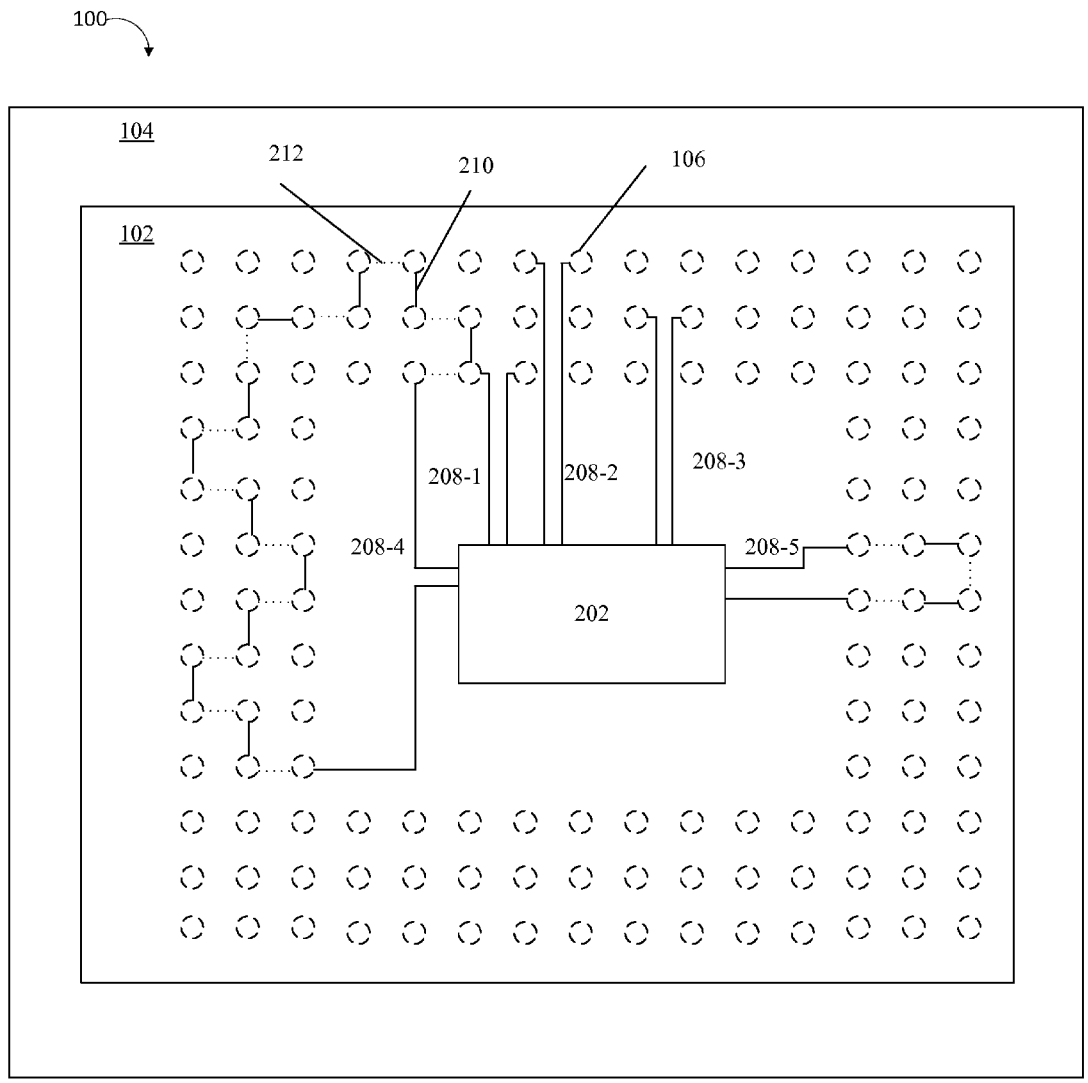
Figure 3:
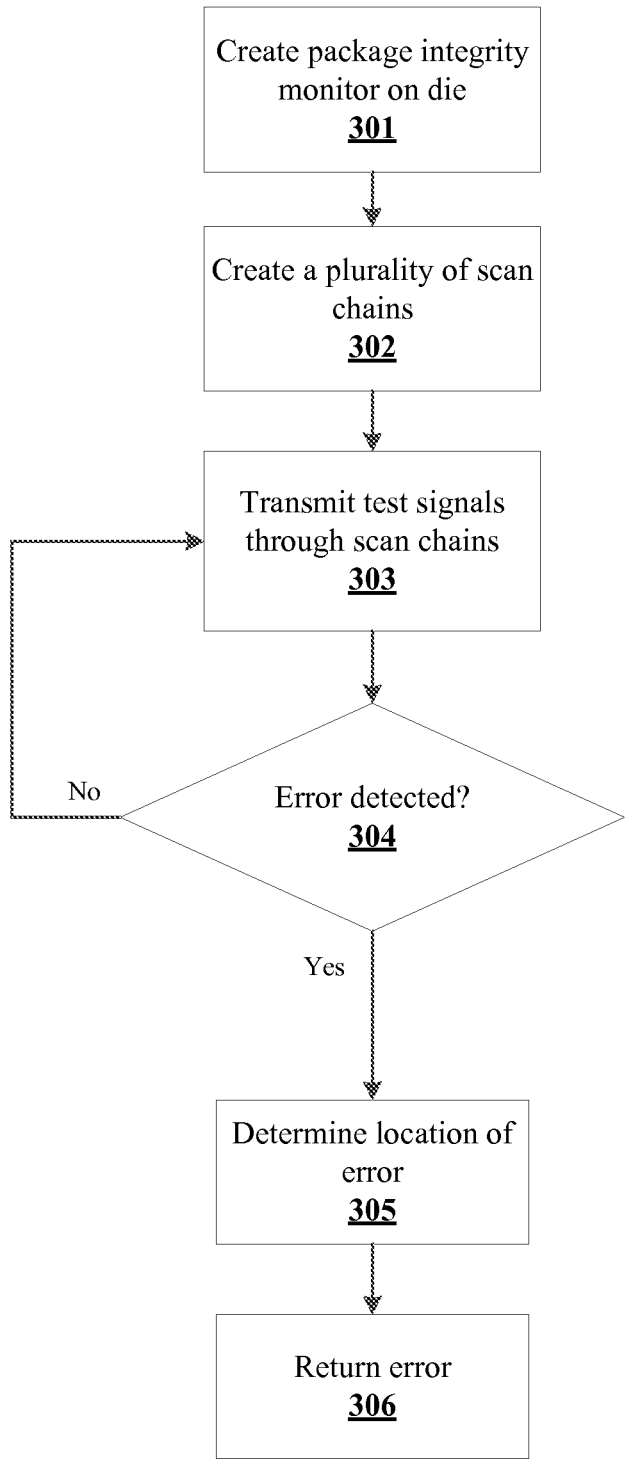

FIG. 2-3 illustrates a top view of an IC package 100 with additional scan chains 208-4 and 208-5. The IC package 100 also includes the scan chains 208-1 to 208-3 discussed with reference to FIG. 2-2, which are omitted for clarity. As shown in FIG. 2-3, the scan chains 208-4 and 208-5 have irregular patterns. In some cases, not all dummy bumps 106 need to be included in a scan chain 208. Instead, a scan chain 208 may be configured (e.g., to have certain extent and/or to be at certain location) to cover certain area(s) on the die 102 that may be of greater interest. For example, certain area(s) on the die may be considered to be at a higher risk for mechanical bonding failures, such as the corners of the die 102 due to the greater amount of mechanical stress in those areas. Other areas may be considered to be of higher interest due to proximity to important active circuit elements in the device. Scan chains 208-4 and 208-5 may be configured to serially chain dummy bumps 106 located in these areas of interest.

In some cases, the scan chains 208-4 and 208-5 may optionally be configured to overlap with scan chains 208-1, 208-2, or 208-3. In such cases, it is possible for some of the dummy bumps 106 to be a part of more than one scan chain (e.g., two scan chains).

The package integrity monitor 202 may contain logic to diagnose results from different scan chains 208. This would allow for the location of the failure to be narrowed down to a smaller number of dummy bumps 106, or even to a single dummy bump 106. For example, in the IC package 100 shown in FIG. 2-3, if the package integrity monitor 202 detects a failure on scan chain 208-3 and a failure on scan-chain 208-5, the source of the failure may be narrowed down to an area of two dummy bumps 106 (i.e., the two dummy bumps 106 that are common in both scan chains 208-3 and 208-5). In some cases, graph theory may optionally be used to determine the most efficient set of scan chains in order to maximize test coverage.

In some cases, the package integrity monitor 202 may optionally be configured to transmit test signal(s), and to detect potential errors by measuring different aspects of the received signal(s). For example, in some cases, the package integrity monitor 202 may include a time-to-digital converter (TDC). The TDC may be configured to start when a test signal enters a scan chain 208 and stop when the test signal is received at the receiver on the other side of the scan chain 208. This would allow the package integrity monitor 202 to measure the amount of time for a test signal to propagate through a particular scan chain 208.

The time it takes for a test signal to propagate through a scan chain 208 may depend on a variety of factors. Changes in temperature and voltage, as well as mechanical stress on the microbumps may all affect the result measured by the TDC. Deterioration of a microbump connection may cause the time for a signal to travel through the scan chain 208 to exceed an allowable range, before a total failure that causes a discontinuity in the scan chain 208. For a given IC package, it is possible to calculate an allowable range for which the TDC measurement for a particular scan chain 208 may vary. Measurements outside of that allowable range may be indicative of an impending failure in the scan chain 208. In some cases in which the IC package has multiple scan chains 208, there may be multiple allowable ranges that correspond with the respective scan chains 208.

In some cases, each scan chain 208 may optionally be configured to act as an RC load in an oscillation network. The oscillator may be a distributed ring oscillator around the scan chain nodes. In some cases, a phase-locked loop (PLL) may be used to create the oscillator signal. The PLL may be a custom PLL instantiated in the package integrity monitor 202. In other cases, the oscillator signal may be muxed onto global clock resources of the die 102 using an existing PLL in the die 102. The frequency of oscillation may be affected by factors such as temperature, voltage, and mechanical stress. By measuring the oscillation frequency, such as with a counter, the state of each scan chain 208 may be determined. If the oscillation frequency falls outside an allowable range, an error may be returned.

In some cases, the concepts above may be extended to monitoring the connection between the interposer 104 and the substrate that are connected to each other through the bumps 110 (e.g., C4 balls). In such cases, the package integrity monitor may be located in the interposer 104. However the process of routing interconnects through the interposer 104, substrate, and C4 balls will often be more costly, making standard connectivity checks, such as a Joint Action Test Group (JTAG) boundary scan, more practical in some situations. For some systems requiring high reliability in harsh thermo-mechanical environments, the added cost may be considered worthwhile.

In one implementation, to monitor the connection between the interposer 104 and the substrate, an apparatus with package integrity monitoring capability may be provided. The apparatus may include: a substrate connected to an interposer through a plurality of bumps (e.g., C4 balls), wherein at least some of the bumps comprise dummy bumps; a package integrity monitor having a transmitter to transmit a test signal and a receiver to receive the test signal; and a first scan chain having a plurality of alternating interconnects in the interposer and in the substrate connecting some of the dummy bumps in series. The first scan chain may have a first end coupled to the transmitter of the package integrity monitor and a second end coupled to the receiver of the package integrity monitor. Optionally, the package integrity monitor may be configured to provide a failure signal if there is a discontinuity in the first scan chain. In some cases, the package integrity monitor may optionally include a time-to-digital converter configured to measure a time for the test signal to travel through the first scan chain. In such cases, the package integrity monitor may be configured to provide a failure signal if the measured time through the first scan chain is outside an allowable range. In other cases, the first scan chain may optionally include a load in an oscillator network. In such cases, the package integrity monitor may be configured to measure an oscillation frequency of the oscillator network, and provides a failure signal if the oscillation frequency is outside an allowable range.

In some cases, the package integrity monitor 202 described herein may be configured to both monitor the connection between the die 102 and the interposer 104, and to monitor the connection between the interposer 104 and the substrate.

Also, in some cases, the package integrity monitor 202 described herein may include an output for providing a failure signal when a scan chain 208 fails to transmit a test signal received from the transmitter 204 to the receiver 206. The failure signal may be transmitted to an indicator, such as a visual indicator (e.g., a LED, a display, etc.) and/or an audio indicator (e.g., a speaker) for informing a user of the detected failure. The failure signal may optionally include a value for indicating an identity of the scan chain 208 in which an error occurred. In one implementation, the package integrity monitor 202 may be configured to automatically output the failure signal in response to a detected error. In another implementation, the failure signal may be stored in the package integrity monitor 202. In such cases, the failure signal may be provided to a user in response to the user accessing the package integrity monitor 202.

The package integrity monitor 202 has been described as being on the die 102 or the interposer 104 of the IC package 100. Thus, the IC package 100 and the package integrity monitor 202 may be considered to be parts of an apparatus (e.g., a device). In other cases, the package integrity monitor 202 may be remote from the IC package 100. For example, in other embodiments, the package integrity monitor 202 may be communicatively coupled to the IC package 100, e.g., by one or more wires, or wirelessly. In such cases, the package 100 and the package integrity monitor 202, while being separate devices, may be considered to be parts of an apparatus (e.g., a system that includes the package 100 and the package integrity monitor 202 communicatively coupled to each other). For example, the die 102 or the interposer 104 (or another component of the package 100) may include a signal receiver for receiving a signal transmitted wirelessly from the package integrity monitor 202, and a signal transmitter for transmitting a signal to the package integrity monitor 202 wirelessly. Alternatively, the die 102 or the interposer 104 (or another component of the IC package 100) may include terminal(s) for communicatively and detachably coupled to the package integrity monitor 202 via a connector (e.g., one or more conductors). In such cases, the package integrity monitor 202 may communicate with the IC package 100 via the terminal(s).

FIG. 3 illustrates a method of using dummy bumps in a IC package to implement package integrity tests. First, at item 301, a package integrity monitor is created on the die. The package integrity monitor may be any of the package integrity monitors 202 discussed previously with reference to FIGS. 2-1 to 2-3. The package integrity monitor may include a transmitter and a receiver. As described above, in some cases, the package integrity monitor may optionally include a TDC. In other cases, the package integrity monitor may include an oscillator.

Returning to FIG. 3, in item 302, a plurality of scan chains is created, wherein each scan chain connects in series a plurality of dummy bumps. The scan chains may be any of the scan chains 208 discussed previously with reference to FIGS. 2-1 to 2-3. As described above, in some cases, there may be one scan chain 208 for each ring of dummy bumps 106. In other cases, there may be scan chains 208 configured to cover areas on the die 102 considered problematic or sensitive. In some cases, the scan chains 208 may also be configured for maximum test coverage.

Return to FIG. 3, once the scan chains are created, at item 303 test signals generated at the package integrity monitor are transmitted from the transmitter of the package integrity monitor to the plurality of scan chains, respectively. In some cases, each test signal may be a constant logic high. In other cases, the test signal may be a pulse or an oscillating signal. Also, the generating and transmitting of the test signals may be performed during a manufacturing process for the IC package that includes the package integrity monitor, during an operation life of the IC package, or both.

Next, in item 304, a determination is made as to whether there has been an error (or failure). Such may be accomplished based on reception of the test signal(s) and/or lack of reception of one or more test signals by the receiver of the package integrity monitor. In some embodiments, an error may be considered detected if the test signal is not received at the receiver of the package integrity monitor due to a discontinuity in one or more of the scan chains. This may be detected by the receiver of the package integrity monitor receiving a logic low. In some cases in which a TDC is used to measure time for the signal to travel through the scan chain, a discontinuity would cause the TDC to time out. In some cases, an error may be considered detected if the time for the signal to travel through the scan chain exceeds a predetermined allowable time. In other cases, an error may be considered detected if a frequency of an oscillating test signal is outside a range of allowable frequencies.

If no error is detected, the method returns to item 303, in which additional test signals are generated and transmitted by the package integrity monitor to further test the package. The generation and transmission of the test signals may be performed periodically, such as in certain pre-determined intervals (e.g., every hour, every day, every month, etc.), or in response to a detected event (e.g., powering up of a device that includes the IC package).

If an error is detected, the method proceeds to item 305, where the package integrity monitor may utilize logic to determine where a failure occurred. If there are no overlapping scan chains, then the determination result will simply be the particular scan chain that the error occurred in. However, in embodiments with overlapping scan chains, results from different scan chains may be analyzed to narrow the possible locations of failure to a smaller set of microbumps.

In item 306, the package integrity monitor provides a failure signal to indicate that a failure has been detected. The failure signal may be provided automatically by the package integrity monitor in response to the detected discontinuity in one or more of the scan chains. Alternatively, the failure signal may be provided in response to a request by a user who accesses the package integrity monitor. In some cases, the failure signal may indicate the location, or possible locations, in which the failure occurs.

In some cases, the package integrity monitor described herein may be applied to a die attached in standard flip chip packages.

Although particular features have been shown and described, it will be understood that they are not intended to limit the claimed invention, and it will be clear to those skilled in the art that various changes and modifications may be made without departing from the scope of the claimed invention. The specification and drawings are, accordingly, to be regarded in an illustrative rather than restrictive sense. The claimed invention is intended to cover alternatives, modifications, and equivalents.

The invention claimed is:

1. An apparatus with package integrity monitoring capability, comprising:
 a package having a die connected to an interposer through a plurality of bumps, wherein at least some of the bumps comprise dummy bumps;
 a package integrity monitor having a transmitter to transmit a test signal and a receiver to receive the test signal; and
 a first scan chain comprising a plurality of the dummy bumps of the plurality of bumps connected in series via a plurality of interconnects, the plurality of interconnects including a first interconnect within the die that couples a first dummy bump of the plurality of bumps to a second dummy bump of the plurality of bumps and a second interconnect within the interposer that couples the second dummy bump to a third dummy bump of the plurality of bumps, wherein the first scan chain has a first end coupled to the transmitter of the package integrity monitor and a second end coupled to the receiver of the package integrity monitor.

2. The apparatus of claim 1, wherein the package integrity monitor is configured to provide a failure signal if there is a discontinuity in the first scan chain.

3. The apparatus of claim 1, further comprising a second scan chain, wherein the package integrity monitor is configured to determine which of the first scan chain and the second scan chain in which an error has occurred.

4. The apparatus of claim 1, wherein the package integrity monitor is configured to transmit additional signals during an operation of the package.

5. The apparatus of claim 1, wherein the package integrity monitor further comprises a time-to-digital converter configured to measure a time for the test signal to travel through the first scan chain.

6. The apparatus of claim 5, wherein the package integrity monitor is configured to provide a failure signal if the measured time through the first scan chain is outside an allowable range.

7. The apparatus of claim 1, wherein the first scan chain comprises a load in an oscillator network.

8. The apparatus of claim 7, wherein the package integrity monitor is configured to measure an oscillation frequency of the oscillator network, and provide a failure signal if the oscillation frequency is outside an allowable range.

9. The apparatus of claim 1, further comprising a second scan chain, wherein at least one of the dummy bumps is both a part of first scan chain and a part of the second scan chain.

10. The apparatus of claim 1, wherein the first scan chain forms a first ring, and the apparatus further comprises a second scan chain forming a second ring that surrounds the first ring.

11. An apparatus with package integrity monitoring capability, comprising:
 a substrate connected to an interposer through a plurality of bumps, wherein at least some of the bumps comprise dummy bumps;
 a package integrity monitor having a transmitter to transmit a test signal and a receiver to receive the test signal; and
 a first scan chain having a first scan chain comprising a plurality of the dummy bumps of the plurality of bumps connected in series via a plurality of interconnects, the plurality of interconnects including a first interconnect within the substrate that couples a first dummy bump of the plurality of bumps to a second dummy bump of the plurality of bumps and a second interconnect within the interposer that couples the second dummy bump of the plurality of bumps to a third dummy bump of the plurality of bumps, wherein the first scan chain has a first end coupled to the transmitter of the package integrity monitor and a second end coupled to the receiver of the package integrity monitor.

12. The apparatus of claim 11, wherein the package integrity monitor is configured to provide a failure signal if there is a discontinuity in the first scan chain.

13. The apparatus of claim 11, wherein the package integrity monitor further comprises a time-to-digital converter configured to measure a time for the test signal to travel through the first scan chain; and
 wherein the package integrity monitor is configured to provide a failure signal if the measured time through the first scan chain is outside an allowable range.

14. The apparatus of claim 11, wherein the first scan chain comprises a load in an oscillator network; and wherein the package integrity monitor is configured to measure an oscillation frequency of the oscillator network, and provide a failure signal if the oscillation frequency is outside an allowable range.

15. A method for monitoring integrity of a package comprising a die connected to an interposer through a plurality of bumps, wherein at least some of the bumps comprise dummy bumps, the method comprising:

generating a test signal by a package integrity monitor located at the package; and transmitting the test signal through a first scan chain, the first scan chain comprising a first scan chain comprising a plurality of the dummy bumps of the plurality of bumps connected in series via a plurality of interconnects, the plurality of interconnects including a first interconnect within the die that couples a first dummy bump of the plurality of bumps to a second dummy bump of the plurality of bumps and a second interconnect within the interposer that couples the second dummy bump of the plurality of bumps to a third dummy bump of the plurality of bumps.

16. The method of claim 15, further comprising receiving the test signal by the package integrity monitor.

17. The method of claim 15, further comprising providing a failure signal if the package integrity monitor does not receive the test signal from the first scan chain.

18. The method of claim 15, wherein the test signal is transmitted during an operation of the package.

19. The method of claim 15, further comprising:

using a time-to-digital converter to measure a time for the test signal to travel through the first scan chain; and providing a failure signal if the measured time is outside an allowable range.

20. The method of claim 15, wherein the first scan chain comprises a load on an oscillator network, and the method further comprises providing a failure signal if an oscillation frequency of the oscillation network is outside an allowable range.

* * * * *